(12) United States Patent
Wei et al.

(10) Patent No.: US 10,388,529 B2
(45) Date of Patent: Aug. 20, 2019

(54) METHOD FOR PREPARING SUBSTRATE WITH INSULATED BURIED LAYER

(71) Applicant: Shanghai Simgui Technology Co., Ltd., Shanghai (CN)

(72) Inventors: Xing Wei, Shanghai (CN); Yongwei Chang, Shanghai (CN); Meng Chen, Shanghai (CN); Guoxing Chen, Shanghai (CN); Lu Fei, Shanghai (CN); Xi Wang, Shanghai (CN)

(73) Assignee: SHANGHAI SIMGUI TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 15/905,344

(22) Filed: Feb. 26, 2018

(65) Prior Publication Data

US 2018/0197741 A1  Jul. 12, 2018

(30) Foreign Application Priority Data

Dec. 27, 2016  (CN) .......................... 2016 1 1225994

(51) Int. Cl.
| | | |
|---|---|---|
| *H01L 21/265* | (2006.01) | |
| *H01L 21/762* | (2006.01) | |
| *H01L 27/12* | (2006.01) | |

(52) U.S. Cl.
CPC .......... *H01L 21/265* (2013.01); *H01L 21/762* (2013.01); *H01L 27/1203* (2013.01)

(58) Field of Classification Search
CPC .. H01L 21/265; H01L 27/1203; H01L 21/762
See application file for complete search history.

(56) References Cited

U.S. PATENT DOCUMENTS

| | | | |
|---|---|---|---|
| 7,741,193 B2 | 6/2010 | Park | |
| 9,275,892 B2 * | 3/2016 | Daix | ................. H01L 21/76254 |

(Continued)

FOREIGN PATENT DOCUMENTS

| | | |
|---|---|---|
| CN | 1241803 A | 1/2000 |
| CN | 101901754 | 12/2010 |
| CN | 102290369 | 12/2011 |

OTHER PUBLICATIONS

Chinese Office Action (including English translation) issued in corresponding CN Patent Application No. 201611227767.3, dated Nov. 20, 2018, 11 pages.

*Primary Examiner* — Sonya D. McCall-Shepard
(74) *Attorney, Agent, or Firm* — Arch & Lake LLP

(57) ABSTRACT

A method for preparing a substrate with an insulating buried layer includes: providing a substrate, the substrate having a supporting layer and an insulating layer arranged on a surface of the supporting layer; performing first ion implantation, implanting modified ions into the substrate, wherein a distance from an interface between the insulating layer and the supporting layer to a Gaussian distribution peak of modified ion concentration is less than 50 nm, such that the modified ions form a nano cluster in the insulating layer; and performing a second ion implantation, continuing to implant the modified ions into the insulating layer, wherein the ions are implanted in the same way as the first ion implantation, and a distance from a Gaussian distribution peak of modified ion concentration in this step to the Gaussian distribution peak of modified ion concentration in the first ion implantation is less than 80 nm.

19 Claims, 3 Drawing Sheets

(56) References Cited

U.S. PATENT DOCUMENTS

| | | | |
|---|---|---|---|
| 2003/0189229 A1* | 10/2003 | Mouli | H01L 29/66772 257/347 |
| 2004/0029358 A1 | 2/2004 | Park | |
| 2004/0171196 A1 | 9/2004 | Walitzki | |
| 2006/0099791 A1 | 5/2006 | Mitani | |
| 2009/0098704 A1 | 4/2009 | Ohnuma | |
| 2010/0187649 A1 | 7/2010 | Allibert | |
| 2018/0190539 A1 | 7/2018 | Wei | |
| 2018/0197741 A1 | 7/2018 | Wei | |

* cited by examiner

METHOD FOR PREPARING SUBSTRATE WITH INSULATED BURIED LAYER

The present application is based on and claims the priority to Chinese patent application No. CN201611225994.2, filed on Dec. 27, 2016, which is incorporated by reference herein in its entirety.

TECHNICAL FIELD

The present disclosure relates to the field of semiconductor materials, and in particular, relates to a method for preparing a substrate with an insulating buried layer.

BACKGROUND

In the prior art, a typical substrate structure with an insulating buried layer includes three layers, which are sequentially a supporting layer, an insulating layer on the surface of the supporting layer, and a device layer on the surface of the insulating layer. In some application scenarios, to prevent carriers from being excited by high-energy rays and thus migrating from the exterior of the substrate, a layer of carrier trapping centers needs to be introduced to the substrate to trap these carriers, so as to improve the electrical properties of the electronic devices in the device layer. However, in practice, to introduce the carrier trapping center, extra modified ions need to be introduced by means of implantation and the like. Therefore, how to effectively introduce the carrier trapping center is a problem to be urgently solved.

SUMMARY

The technical problem to be solved by the present disclosure is to provide a method for preparing substrate with an insulating buried layer includes, using which a carrier trapping center may be more effectively introduced.

A method for preparing a substrate with an insulating buried layer includes: providing a substrate, the substrate having a supporting layer and an insulating layer arranged on a surface of the supporting layer; performing first ion implantation, implanting modified ions into the substrate, wherein a distance from an interface between the insulating layer and the supporting layer to a Gaussian distribution peak of modified ion concentration is less than 50 nm, such that the modified ions form a nano cluster in the insulating layer; and performing a second ion implantation, continuing to implant the modified ions into the insulating layer, wherein the ions are implanted in the same way as the first ion implantation, and a distance from a Gaussian distribution peak of modified ion concentration in this step to the Gaussian distribution peak of modified ion concentration in the first ion implantation is less than 80 nm, such that a nano cluster distribution region is widened.

Optionally, the modified ions are derived from one of chemical elements forming the insulating layer, or the modified ions are derived from a congener in chemical elements forming the insulating layer. The insulating layer is made from silicon dioxide, and the modified ions are silicon or germanium ions.

Optionally, the insulating layer is an insulating buried layer or is located on the surface of the substrate.

Optionally, the second ion implantation has an energy that is less than that of the first ion implantation.

Optionally, the first ion implantation has an implantation amount in the range of $3\times10^{15}$ cm$^{-2}$ to $2\times10^{16}$ cm$^{-2}$.

Optionally, the first ion implantation is performed at a temperature higher than 400° C.

Optionally, the first ion implantation and the second ion implantation have the same implantation amount.

Optionally, the second ion implantation is repeatedly performed to more significantly widen the nano cluster distribution.

Optionally, upon completion of the first ion implantation, the method further includes a heat treatment step.

According to the present disclosure, multiple implantations are employed, more modified ions are acquired by means of widening the implantation region, so as to acquire more trapping centers. Since the modified ions are distributed in a wider region and the density of the ions is not increased, no greater mismatch stress may be introduced, such that impacts to the integrity of the lattice of the top semiconductor layer are mitigated.

DETAILED DESCRIPTION

Embodiments illustrating a method for preparing a substrate with an insulating buried layer according to the present disclosure are described in detail with reference to the accompanying drawings.

Figure 1:
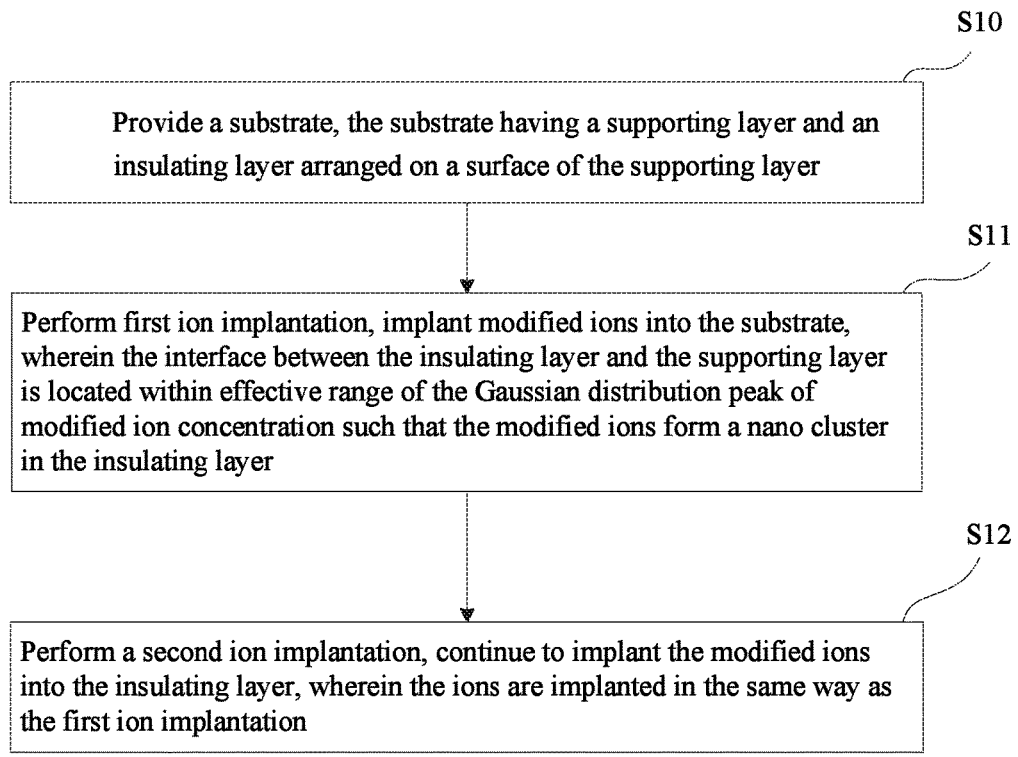
FIG. 1 is a schematic diagram of steps of a method for preparing a substrate with an insulating buried layer according to an aspect of the present disclosure.

FIG. 1 is a schematic diagram of steps of a method for preparing a substrate with an insulating buried layer according to an aspect of the present disclosure. The method includes: step S10 providing a substrate, the substrate having a supporting layer and an insulating layer arranged on a surface of the supporting layer; step S11 performing first ion implantation, implanting modified ions into the substrate, wherein a distance from an interface between the insulating layer and the supporting layer to a Gaussian distribution peak of modified ion concentration is less than 50 nm, such that the modified ions form a nano cluster in the insulating layer; and step S12 performing a second ion implantation, continuing to implant the modified ions into the insulating layer, wherein the ions are implanted in the same way as the first ion implantation, and a distance from a Gaussian distribution peak of modified ion concentration in this step to the Gaussian distribution peak of modified ion concentration in the first ion implantation is less than 80 nm, such that a nano cluster distribution region is widened.

Figure 2A:
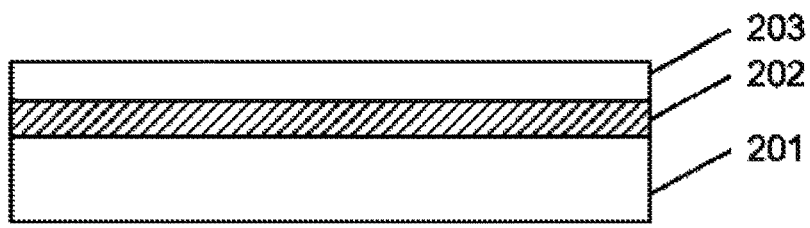
FIG. 2A illustrates a structure corresponding to a step in a schematic process of the method for preparing a substrate with an insulating buried layer according to an aspect of the present disclosure.
Figure 2B:
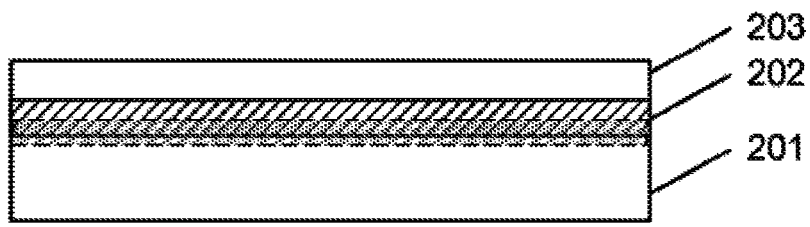
FIG. 2B illustrates a structure corresponding to a second step in a schematic process of the method for preparing a substrate with an insulating buried layer according to an aspect of the present disclosure.
Figure 2C:
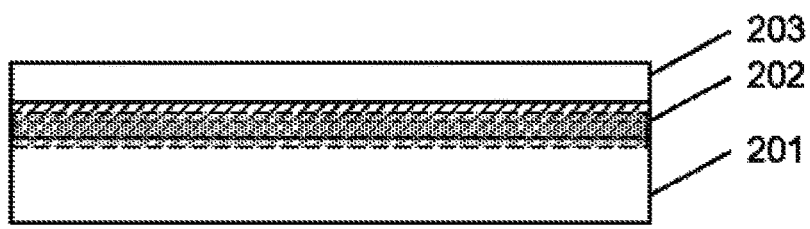
FIG. 2C illustrates a structure corresponding to a third step in a schematic process of the method for preparing a substrate with an insulating buried layer according to an aspect of the present disclosure.

FIG. 2A to FIG. 2C are schematic process diagrams of the method for preparing a substrate with an insulating buried layer according to an aspect of the present disclosure.

As illustrated in FIG. 2A, referring to step S10, a substrate 200 is provided, wherein the substrate 200 is provided with an insulating layer 202. In this aspect, the substrate 200 includes a supporting layer 201, an insulating layer 202 and a top semiconductor layer 203, wherein the insulating layer is an insulated buried layer. In another aspect, the substrate to which ions are implanted may also not include the top semiconductor layer 203, the insulating layer 202 is located on the surface of the substrate 200, and the top semiconductor layer 203 is formed in the subsequent process by means of bonding or epitaxy. In this aspect, the insulating layer 202 is made from silicon dioxide. In another aspect, the insulating layer 202 may also be made from silicon nitride, silicon oxynitride, germanium-silicon oxide, germanium oxide or another insulating material. The supporting layer 201 may be made from a semiconductor material, or may be made from a substrate material such as sapphire and the like that are applied in the microelectronic field.

Figure 3:
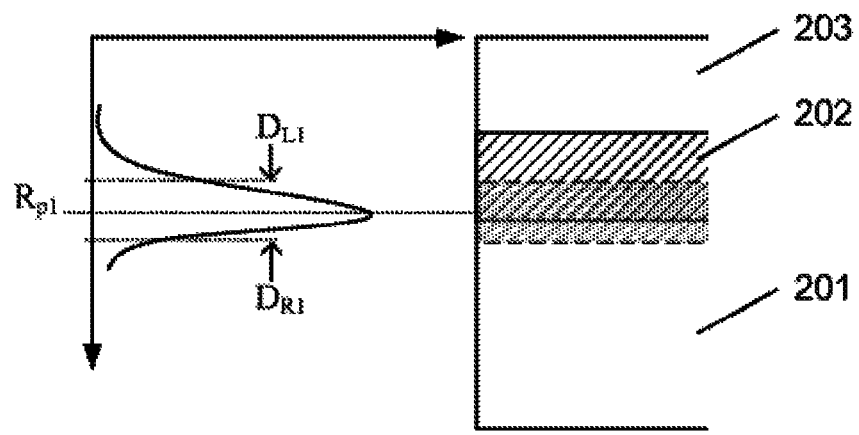
FIG. 3 is a distribution curve of modified ions in a substrate upon a first ion implantation in the method for preparing a substrate with an insulating buried layer according to an aspect of the present disclosure.

As illustrated in FIG. 2B, referring to step S11, first ion implantation is performed, wherein modified ions are implanted into the substrate 200, and a distance from an interface between the insulating layer 202 and the supporting layer 201 to a Gaussian distribution peak of modified ion concentration is less than 50 nm, such that the modified ions form a nano cluster in the insulating layer. FIG. 3 is a distribution curve of modified ions in the substrate 200 upon the first ion implantation. Ion distribution is a symmetric Gaussian distribution. Distribution widening may cause a portion of the ions to enter the supporting layer, and may cause damages to the lattice. Therefore, with respect to this ion implantation, high temperature implantation is preferred, and the implantation temperature is higher than 400° C. In addition, an excessively large implantation amount still causes damages to the lattice. Therefore, the implantation amount should be less than $2 \times 10^{16}$ cm$^{-2}$, and is preferably in the range of $3 \times 10^{15}$ cm$^{-2}$ to $2 \times 10^{16}$ cm$^{-2}$. The modified ions are presented in an asymmetric Gaussian distribution in the substrate 200, wherein a left effective range of the peak Rp1 is DL1, and a right effective range of the peak Rp1 is DR1. In the aspect as illustrated in FIG. 3, the interface between the insulating layer 202 and the supporting layer 201 is located within the right effective range DR1, which is advantageous in that more modified ions are distributed in the insulating layer 202. In this way, the subsequently implanted modified ions more easily achieve the effect of widening the nano cluster aggregation region. In another aspect, the interface between the insulating layer 202 and the supporting layer 201 may also be located within the left effective range DL1.

In this aspect, the modified ions are derived from silicon, such that a silicon-enriched layer is formed in the silicon oxide layer, and thus a silicon-enriched nano cluster is formed upon a further heat treatment. In another aspect, the modified ions may be derived from one of chemical elements forming the insulating layer, for example, germanium or silicon is implanted into germanium-silicon oxide. Alternatively, the modified ions may also be derived from a congener in chemical elements forming the insulating layer 202, for example, germanium is implanted into silicon oxide. Since the congeners have approximate chemical properties, a nano cluster that is capable of effectively trapping carriers may also be formed.

Figure 4:
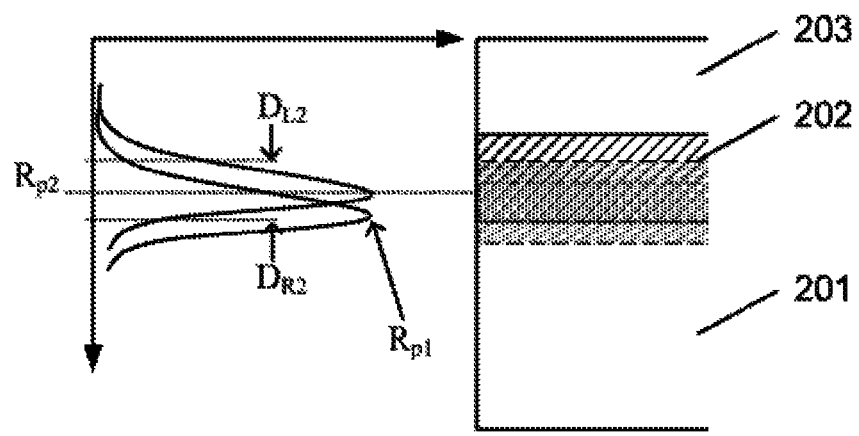
FIG. 4 is a distribution curve of all the implanted modified ions in a substrate upon a second ion implantation in the method for preparing a substrate with an insulating buried layer according to an aspect of the present disclosure.

As illustrated in FIG. 2C, referring to step S13, a second ion implantation is performed, wherein the modified ions are continuously implanted into the insulating layer 202, the ions are implanted in the same way as the first ion implantation, and a distance from a Gaussian distribution peak Rp2 of modified ion concentration in this step to the Gaussian distribution peak Rp1 of modified ion concentration in the first ion implantation is less than 80 nm, such that a nano cluster distribution region is widened. FIG. 4 is a distribution curve of all the modified ions in the substrate 200 upon the second ion implantation. The modified ions that are implanted in the second ion implantation are presented in an asymmetric Gaussian distribution in the substrate 200, wherein an effective range at the left side of the peak Rp2 is DL2, and an effective range at the right side of the peak Rp2 is DR2. If a lower energy is used in this step relative to the previous step and the ion widening may not come to the supporting layer 201, the ions may also be implanted at a room temperature. If the ion widening comes to the supporting layer 201, the implantation amount in this step should also be less than $2 \times 10^{16}$ cm$^{-2}$, and is preferably in the range of $3 \times 10^{15}$ cm$^{-2}$ to $2 \times 10^{16}$ cm$^{-2}$. If upon the ion widening, the ions do not enter the supporting layer 201, the implantation amount is not limited. In this aspect, the second ion implantation has an energy that is less than that of the first ion implantation. Referring to FIG. 4, if the energy in the first ion implantation is less than that in the second ion implantation, the Gaussian distribution peak position Rp2 of modified ion concentration is located within the left effective range DL1 of the Gaussian distribution peak of the first ion implantation, which is advantageous in that more modified ions are distributed in the insulating layer 202. In this way, more nano clusters upon the widening are aggregated in the insulating layer 202. In another aspect, the Gaussian distribution peak position Rp2 may also be located within the right effective range DR1.

In the process of forming a carrier trapping center by implanting the modified ions, more modified ions are favorable to formation of more trapping centers. However, an excessively great density of the modified ions may introduce an extra mismatch stress, which affects integrity of the lattice of the top semiconductor layer 203. Therefore, in this embodiment, multiple implantations are employed, more modified ions are acquired by means of widening the implantation region, so as to acquire more trapping centers. Since the modified ions are distributed in a wider region and the density of the ions is not increased, no greater mismatch stress may be introduced, such that impacts to the integrity of the lattice of the top semiconductor layer 203 are mitigated.

If the wide requirement of the nano cluster is still not satisfied after the above steps are performed, the steps of the second ion implantation may be repeatedly performed. The peak in each implantation is located within the effective range of the previous implantation, to more significantly widen the nano cluster distribution region.

Upon completion of the above steps, a heat treatment is further performed for the implantation region. This improves the effective carrier complex center or electron trap, and hence enhances the operation properties of the materials and devices in a tough environment.

Described above are preferred examples of the present disclosure. It should be noted that persons of ordinary skill in the art may derive other improvements or polishments without departing from the principles of the present disclo-

What is claimed is:

1. A method for preparing a substrate with an insulating buried layer, comprising:
    providing a substrate, the substrate having a supporting layer and an insulating layer arranged on a surface of the supporting layer;
    performing a first ion implantation by implanting modified ions into the insulating layer of the substrate, wherein a distance from an interface between the insulating layer and the supporting layer to a Gaussian distribution peak of the modified ion concentration is less than 50 nm, such that the modified ions form a nano cluster in the insulating layer; and
    performing a second ion implantation by further implanting additional modified ions into the insulating layer comprising the modified ions from the first ion implantation, wherein a distance from a Gaussian distribution peak of modified ion concentration in the second ion implantation to the Gaussian distribution peak of modified ion concentration in the first ion implantation is less than 80 nm, such that a nano cluster distribution region is widened.

2. The method for preparing a substrate with an insulating buried layer according to claim 1, wherein the modified ions are derived from one of chemical elements forming the insulating layer, or the modified ions are derived from a congener in chemical elements forming the insulating layer.

3. The method for preparing a substrate with an insulating buried layer according to claim 2, wherein the insulating layer is made from silicon dioxide, and the modified ions are silicon or germanium ions.

4. The method for preparing a substrate with an insulating buried layer according to claim 1, wherein the insulating layer is an insulating buried layer or is located on the surface of the substrate.

5. The method for preparing a substrate with an insulating buried layer according to claim 1, wherein the second ion implantation has an energy that is less than that of the first ion implantation.

6. The method for preparing a substrate with an insulating buried layer according to claim 1, wherein the first ion implantation has an implantation amount in the range of $3 \times 10^{15}$ cm$^{-2}$ to $2 \times 10^{16}$ cm$^{-2}$.

7. The method for preparing a substrate with an insulating buried layer according to claim 1, wherein the first ion implantation is performed at a temperature higher than 400° C.

8. The method for preparing a substrate with an insulating buried layer according to claim 1, wherein the first ion implantation and the second ion implantation have the same implantation dosage of modified ions.

9. The method for preparing a substrate with an insulating buried layer according to claim 1, wherein an additional ion implantation is performed by further implanting additional modified ions into the insulating layer comprising the modified ions from the first ion implantation and the second ion implantation to widen the nano cluster distribution.

10. The method for preparing a substrate with an insulating buried layer according to claim 1, wherein upon completion of the second ion implantation, the method further comprises a heat treatment step for the implantation region.

11. A method for preparing a substrate with an insulating buried layer, comprising:
    providing a substrate, the substrate having a supporting layer and an insulating layer arranged on a surface of the supporting layer;
    performing a first ion implantation by implanting modified ions into the insulating layer of the substrate, such that the modified ions form a nano cluster in the insulating layer; and
    performing a second ion implantation by further implanting additional modified ions into the insulating layer comprising modified ions from the first ion implantation, such that the nano cluster distribution region formed in the first ion implantation is widened,
    wherein the first ion implantation and the second ion implantation have the same implantation dosage of modified ions.

12. The method for preparing a substrate with an insulating buried layer according to claim 11, wherein the modified ions are derived from one of chemical elements forming the insulating layer, or the modified ions are derived from a congener in chemical elements forming the insulating layer.

13. The method for preparing a substrate with an insulating buried layer according to claim 11, wherein the insulating layer is made from silicon dioxide, and the modified ions are silicon or germanium ions.

14. The method for preparing a substrate with an insulating buried layer according to claim 11, wherein the insulating layer is an insulating buried layer or is located on the surface of the substrate.

15. The method for preparing a substrate with an insulating buried layer according to claim 11, wherein the second ion implantation has an energy that is less than that of the first ion implantation.

16. The method for preparing a substrate with an insulating buried layer according to claim 11, wherein the first ion implantation has an implantation amount in the range of $3 \times 10^{15}$ cm$^{-2}$ to $2 \times 10^{16}$ cm$^{-2}$.

17. The method for preparing a substrate with an insulating buried layer according to claim 11, wherein the first ion implantation is performed at a temperature higher than 400° C.

18. The method for preparing a substrate with an insulating buried layer according to claim 11, wherein an additional ion implantation is performed by implanting the modified ions into the insulating layer comprising modified ions from the first ion implantation and the second ion implantation to widen the nano cluster distribution.

19. The method for preparing a substrate with an insulating buried layer according to claim 11, wherein upon completion of the second ion implantation, the method further comprises a heat treatment step for the implantation region.

* * * * *